(12) United States Patent
Hancu et al.

(10) Patent No.: US 8,049,501 B2
(45) Date of Patent: Nov. 1, 2011

(54) MULTI-FREQUENCY RF COIL (75) Inventors: Ileana Hancu, Clifton Park, NY (US); Joseph Edward Piel, Scotia, NY (US); William Thomas Dixon, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 268 days.

(21) Appl. No.: 12/420,098

(22) Filed: Apr. 8, 2009

(65) Prior Publication Data
US 2009/0256569 A1    Oct. 15, 2009

Related U.S. Application Data (60) Provisional application No. 61/044,065, filed on Apr. 11, 2008.

(51) Int. Cl.
*G01V 3/00* (2006.01)
(52) U.S. Cl. ........................................... 324/318
(58) Field of Classification Search .......... 324/300–322; 600/410–435; 333/219–235; 343/718, 720–721, 343/725–730, 741–744, 844, 866–873, 876, 343/878–893, 904–916
See application file for complete search history.

(56) References Cited

U.S. PATENT DOCUMENTS

| | | | |
|---|---|---|---|
| 4,742,304 A | 5/1988 | Schnall et al. | |
| 5,017,872 A | 5/1991 | Foo et al. | |
| 5,041,790 A | 8/1991 | Tropp et al. | |
| 5,162,738 A | 11/1992 | Sepponen | |
| 5,986,455 A | 11/1999 | Magnuson | |
| 6,081,120 A | 6/2000 | Shen | |
| 6,633,161 B1 * | 10/2003 | Vaughan, Jr. | 324/318 |
| 7,268,554 B2 * | 9/2007 | Vaughan | 324/322 |
| 7,659,719 B2 * | 2/2010 | Vaughan et al. | 324/318 |
| 7,719,269 B2 * | 5/2010 | Petersson et al. | 324/307 |
| 7,800,368 B2 * | 9/2010 | Vaughan et al. | 324/318 |
| 2002/0145427 A1 | 10/2002 | Wong et al. | |
| 2008/0278163 A1 | 11/2008 | Hancu et al. | |

FOREIGN PATENT DOCUMENTS

| | | |
|---|---|---|
| EP | 0498571 | 8/1992 |
| WO | WO9213283 | 8/1992 |
| WO | W02004001434 A1 | 12/2003 |
| WO | WO2008001326 | 1/2008 |

OTHER PUBLICATIONS

Hancu et al., " Accurate Flip-Angle Calibration for 13C MRI", Magnetic Resonance in Medicine, vol. 58, No. 1, Jul. 2007, pp. 128-133.
Hancu et al., "Three-Frequency RF Coil Designed for Optimized Imaging of Hyperpolarized, 13 C-Labeled Compounds", Magnetic Resonance in Medicine, vol. 60, Issue #4, Published on-line Sep. 24, 2008, pp. 928-333.

(Continued)

*Primary Examiner* — Dixomara Vargas
(74) *Attorney, Agent, or Firm* — Scott J. Asmus (57) ABSTRACT

A multi-frequency imaging radio frequency (RF) coil operational at three or more different frequencies, with a shifting frequency loop structure proximate the coil and switchably coupled to provide different frequencies when the loop structure is coupled to the coil. In one embodiment one of the frequencies is a proton frequency, one is a sodium frequency, and one of the frequencies is a carbon frequency. One example involves imaging examinations using hyperpolarized compounds.

19 Claims, 7 Drawing Sheets

OTHER PUBLICATIONS

Lu et al., "A Technique of Double-Resonant Operation of 19F and 1H Quadrature Birdcage Coils", Magnetic Resonance in Medicine, vol. 19, No. 1, pp. 180-185, May 1, 1991.

Muftuler et al., Automatic Tuned MRI RF Coil for Multinuclear Imaging of Small Animals at 3T, Journal of Magnetic Resonance, vol. 155, No. 1, pp. 39-44, 2002.

PCT International Search Report dated Oct. 19, 2009.

* cited by examiner

MULTI-FREQUENCY RF COIL

CROSS REFERENCE TO RELATED APPLICATIONS

This application claims the benefit of U.S. Provisional Application No. 61/044,065, filed Apr. 11, 2008, which is herein incorporated in its entirety by reference.

BACKGROUND

Magnetic resonance imaging (MRI) and nuclear magnetic resonance imaging (NMRI) are medical imaging techniques used to visualize certain structural aspects and functionality of human and animal subjects. The imaging typically uses a magnetic field to align certain atoms in the body in the direction of the magnetic field. Changes to the alignment cause a rotating magnetic field that can be detected. Contrast agents can be used to enhance imaging by, e.g., providing additional types of atoms for imaging. Variants of magnetic imaging are known in the art.

In a standard imaging acquisition, there is a prescan process for determining the optimal parameters to be used for the scan process. Prescan has multiple steps, such as the determination of the exact scanner carrier frequency, receiver gains, and signal amplification (or transmit gain), all of which are used to insure maximum detected signal. The process of prescan is typically performed at the same frequency as the frequency of the imaging experiment.

The use of hyperpolarized molecules in conjunction with magnetic resonance imaging has advanced magnetic resonance imaging into the realm of metabolic imaging. Typically, in an exam in which hyperpolarized compounds labeled with $^{13}C$ atoms are injected in a subject, two coils are used, one tuned at the proton frequency and one at the carbon frequency. In some examples, a single, dual tuned coil is used.

One difficulty when performing imaging in the presence of $^{13}C$, hyperpolarized compounds is the calibration of the system such that optimal imaging is performed. Prior to the injection of the hyperpolarized compounds, there is typically insufficient naturally occurring $^{13}C$ signal that can be used for flip angle calibration. The labeled compound is typically injected into the subject, and images of anatomical distribution of the injected hyperpolarized compound and its downstream products are obtained. The signal from the injected compound is time varying; it changes in time due to relaxation, flow, perfusion and metabolism. For minimal signal loss to occur, it is important that imaging takes place soon after the injection occurs without lengthy procedures for calibration.

Unless a lipid-rich area exists in the region to be imaged with enough natural abundance $^{13}C$, flip angle calibration is usually not performed in vivo. In some cases, the calibration is initially performed in a phantom designed to mimic the in vivo subjects. In these phantom calibrations, the value for the transmit gain is obtained and used for all the in vivo exams, ignoring the different loading provided by different subjects. Alternatively, a phantom containing carbon enriched material can be added in the imaging region, and flip angle (FA) calibration is performed using the signal from this phantom. However, since this phantom has to be inserted in the coil in the presence of the subject, it has to be small, leading to some inaccuracies in FA calibration due to limited signal availability from the small phantom sample. Moreover, such a phantom has to be inherently positioned near the coil, where the radio-frequency magnetic field ($B_1$) tends to be inhomogeneous, and potentially significantly different than the $B_1$ in the center of the coil, where the subject sits. Consequently, conventional approaches for FA calibration are not particularly accurate and can lead to undesired signal loss. Improved techniques for calibration would enhance the hyperpolarized imaging technology and make the systems more commercially attractive.

BRIEF DESCRIPTION

Embodiments of the invention relate generally to a multi-frequency RF coil for imaging and particularly for imaging hyperpolarized labeled compounds.

One embodiment is a multi-frequency imaging coil, having a radio-frequency coil operational at three or more different frequencies. This includes a shifting frequency structure proximate the radio-frequency coil and switchably coupled to provide at least one of the frequencies when the shifting frequency structure is coupled to the radio-frequency coil. Another of the frequencies is provided when the shifting frequency structure is uncoupled from the radio-frequency coil.

An example of such a radio-frequency coil is a dual-tuned birdcage coil, wherein one of the frequencies is a proton frequency, one of the frequencies is a sodium frequency, and one of the frequencies is a carbon frequency. More specifically, in this example the birdcage coil operates at the proton frequency at $^1H$ approximately 63.87 MHz, the sodium frequency at $^{23}Na$ approximately 16.89 MHz, and in quadrature at the carbon frequency at $^{13}C$ approximately 16.06 MHz.

A further embodiment includes a method for acquiring an image with a multiple frequency imaging coil, including coupling at least one frequency shifting circuit loop to the coil, wherein the shifting circuit loop shifts from a carbon frequency to a sodium frequency when coupled. The method provides for performing an anatomical imaging using a proton frequency, prescan calibrating using a sodium frequency and processing to obtain a flip angle calibration for the carbon frequency. Furthermore, the method provides for uncoupling the frequency shifting circuit loop and performing imaging at the carbon frequency using the flip angle calibration from the prescan calibration.

In yet another embodiment, an imaging system for hyperpolarized compounds, includes an imaging coil operational over at least three frequencies, having at least one frequency shifting loop structure switchably coupled by a switch to the imaging coil, wherein the frequency shifting loop structure shifts one of the frequencies to a frequency for prescan calibration of a subject using a naturally occurring compound in the subject when the frequency shifting loop structure is coupled to the coil and performs a hyperpolarized imaging using the hyperpolarized compounds not abundant enough in the subject when the frequency shifting loop structure is uncoupled.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In the following detailed description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Furthermore, various operations may be described as multiple discrete steps performed in a manner that is helpful for understanding embodiments of the present invention. However, the order of description should not be construed as to imply that these operations need be performed in the order they are presented, nor that they are even order dependent. Moreover, repeated usage of the phrase "in one embodiment" does not necessarily refer to the same embodiment, although it may. Lastly, the terms "comprising", "including", "having", and the like, as well as their inflected forms as used in the present application, are intended to be synonymous unless otherwise indicated.

In accordance with various embodiments of the invention, a single resonant coil structure is capable of operating at three or more frequencies of interest for hyperpolarized scans. The first frequency is used for anatomical localization purposes, and a prescan is used at a second frequency to determine imaging power requirements using a calibration curve from the transmit gain response at the second frequency. Based on the prescan values for the second frequency processing, the amplification level for the third frequency is determined. The imaging at the third frequency is thus performed having insured the amplification level which results in the highest image signal to noise ratio (SNR). Other embodiments and structures are explained herein to accommodate other designs and applications.

As explained, unlike a typical MRI exam, when both prescan and scan steps are performed at the same frequency, the limited availability of natural abundance carbon signal prior to the injection of the hyperpolarized compound generally leads to difficult and often inaccurate flip angle calibration. Accurate flip angle (FA) calibration, which helps maximize image signal-to-noise ratio (SNR), can be performed in vivo using the natural abundance of sodium in the body according to one embodiment of the system. In one embodiment, the resonant structure resonates linearly at the $^1$H (e.g., 63.87 MHz at 1.5 T) and $^{23}$Na (e.g., 16.89 MHz at 1.5 T) frequencies, and in quadrature at the $^{13}$C (e.g., 16.06 MHz at 1.5 T) frequency. As noted, the frequency of $^{23}$Na is somewhat close to $^{13}$C, permitting shifting of the frequency response of the coil to provide the calibration using the naturally occurring sodium. The naturally occurring sodium signal in the body can be used for flip angle calculation and coil sensitivity profile mapping in exams using hyperpolarized $^{13}$C compounds.

Figure 1:
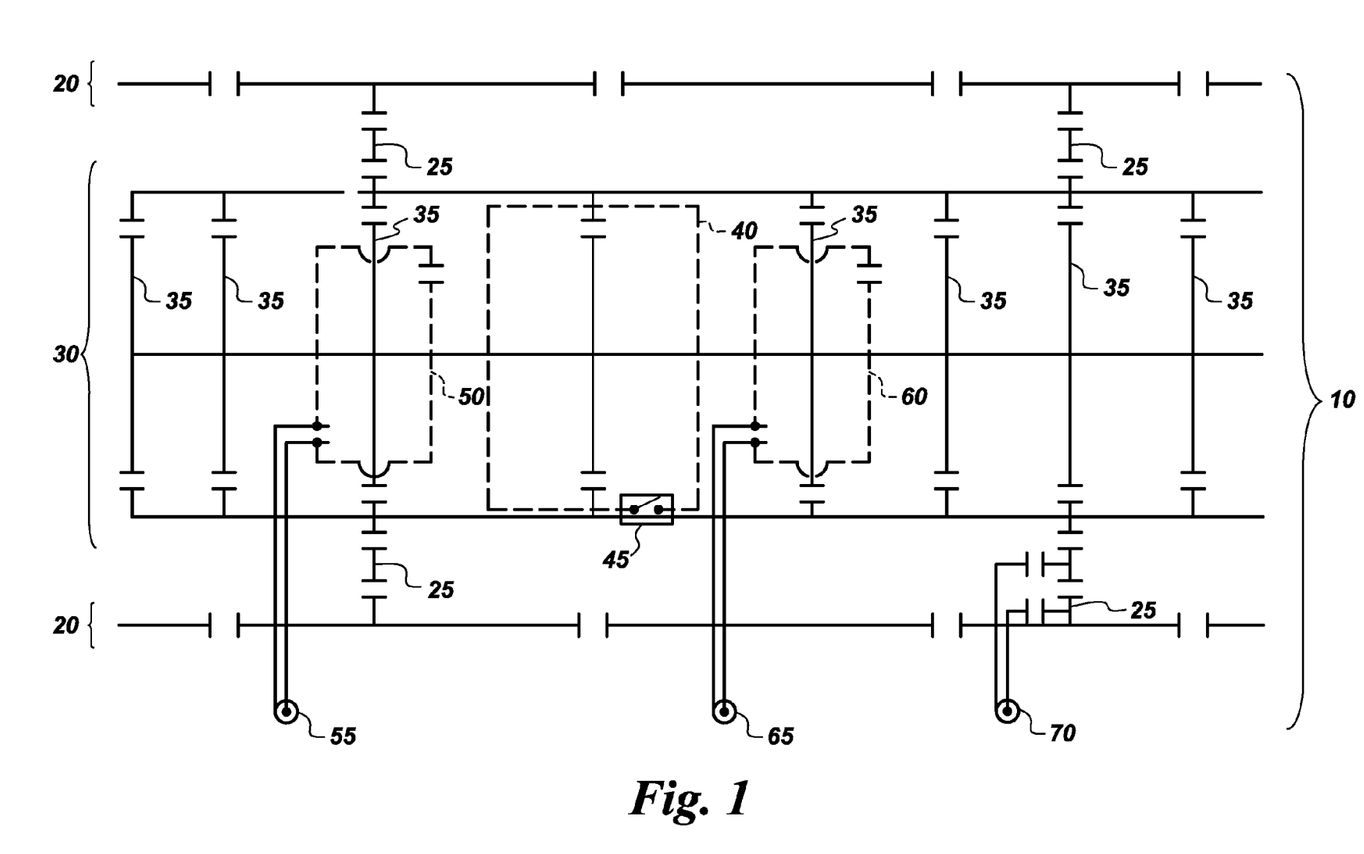
FIG. 1 illustrates a schematic perspective according to one embodiment.

Referring to FIG. 1, an electrical schematic for one embodiment of the multi-frequency RF coil 10 is shown. In this example, the multiple rung birdcage coil is a dual tuned coil with two outer rings 20, two inner rings 30 and with a frequency shifting circuit loop 40 mounted proximate the birdcage coil 10, wherein the shifting frequency circuit loop 40 is switchably coupled in order to shift the frequency response of the inner ring.

In this example, the coil 10 includes a linear coil resonating at the proton frequency delimited by the outer rings 20, a carbon coil delimited by the inner rings 30, and a switchably coupled loop structure 40 that enables shifting of the frequency response for the carbon coil 30 when the loop 40 is closed.

The proton coil delimited by the outer rings 20 in this example also has two rungs 25 with a number of capacitors. The carbon coil 30 has two rings and eight rungs 35. There is at least one frequency shifting circuit loop 40 that is mounted proximate the inner ring 30 that provides mutual coupling of the inner ring 30 when the shifting frequency circuit loop 40 is closed. The effects of the shifting frequency circuit loop 40 are negligible when the loop is an open circuit. The shifting frequency circuit loop 40 in one embodiment is opened and closed by a switch 45 located somewhere along the path of the loop 40. The switch 45 can be mechanical, electro-mechanical or electrical. In one example the switch 45 is a biased diode that can be electrically controlled to open and close the switch 45.

There are a number of properties associated with the shifting frequency circuit loop 40 that enable its operation in order to provide the resonant response required for the second frequency which in one embodiment is for sodium. The size and shape of the loop of the shifting frequency circuit loop 40 as well as the placement and orientation are some of the factors that determine the frequency response that enables operation for two different frequencies. For example, the circuit loop of the shifting circuit 40 in this example is a section of conductive microstrip that is placed onto a dielectric board and positioned over a portion of the inner ring 30 and can be positioned above the coil 10 using spacers, fasteners or dielectric adhesives. The circuit loop of the shifting circuit 40 is tuned to a frequency close to the frequency of the $^{13}$C coil delimited by rings 30, in order to offer maximum mutual coupling to the coil.

The coil delimited by outer rings 20, for example a proton frequency, can be driven from a single coupled output 70 such as shown in this example. In another example there can be two drive points in quadrature for higher signal to noise (SNR). The coupling to the carbon coil delimited by the inner rings 30 can be obtained by using one or more coupling loops 50, 60 that are in close proximity to the carbon coil delimited by inner rings 30. In this example the coupling loops are not electrically coupled to the conductors of the inner coil 30 but rather are placed on small dielectric sections (not shown). The outputs from the two quadrature coupling loops 50, 60 can be taken via two coupling drive cables 55, 65 respectively.

In one embodiment the coil 10 is designed to resonate at three frequencies, namely a proton frequency from the coil delimited by outer rings 20, a sodium frequency from the coil delimited by inner rings 30 with the circuit loop 40 closed, and a carbon response from the coil delimited by the inner rings 30 with the circuit loop 40 open. The frequency response of the coil delimited by the inner rings 30 with the coupling circuit 40 closed depends on the quality factor (Q factor) of the inner coil 30 and the Q factor of the shifting circuit coil 40, as well as on the area of the coupling coil 40 and its placement. For example the closed circuit loop 40 is located proximate to the inner coil 30 to provide good coupling, and rotated until the optimal response for sodium is achieved. At that point, the loop structure 40 can be secured in place for the lifetime of the coil. The location of the shifting circuit loop 40 in one example is empirically derived by placing the circuit loop 40 over the coil 10, while monitoring the frequency response of the structure on a network analyzer.

There are various sizes and shapes for the circuit loop 40. For example, a larger loop would need to be placed further away from the inner ring 30 as the coupling strength would be greater. The circuit loop 40 can be rectangular, square, circular, or other polygonic shape, as well as a meander line, however the shape is just one of the factors in determining the resonant frequency response. Other factors include size of the circuit loop, size of the conductive strips, material of the conductive strip, and gap between the inner coil and the loop structure.

One embodiment is a coil capable of operating at the proton, sodium and carbon frequencies, optimized for imaging of hyperpolarized, carbon labeled compounds. In the illustrated example, a dual tuned, linear proton and quadrature carbon birdcage coil design provides linear operation at the sodium frequency. The frequency-shifting loop in one example is designed so that when the loop is closed, it splits the operating frequency of the coil 30, moving one of its modes to the sodium frequency. One mechanism for providing the frequency shifting capability is a single one-turn loop, placed proximate to the birdcage coil. The electrical circuit of the loop can be opened and closed using, for example, a switching mechanism. Closing the switch results in splitting the operating frequency of the coil 30, and moving one its frequencies to the sodium frequency.

An alternative design to effectively switch the frequency of the dual tuned coil from $^{13}$C to $^{23}$Na is to use variable capacitors on the eight inner coil rungs with appropriate biasing. Given the close proximity of the two resonance frequencies for carbon and sodium, variable capacitors can change their range of operation within 10% with small (<10V) biasing. Alternatively, PIN diodes can be used to add extra capacitance needed to switch between the sodium and carbon frequency. With reverse bias, the PIN diode acts like an open circuit, rendering the coil resonant at the sodium frequency. With a forward bias for the diode, a second capacitor is introduced in the circuit in parallel with the first one, retuning the circuit to the carbon frequency. While requiring more design work, this design has the advantage of a clean, single resonance at the sodium frequency resulting in a better sodium response operating in true quadrature mode.

Figure 2:
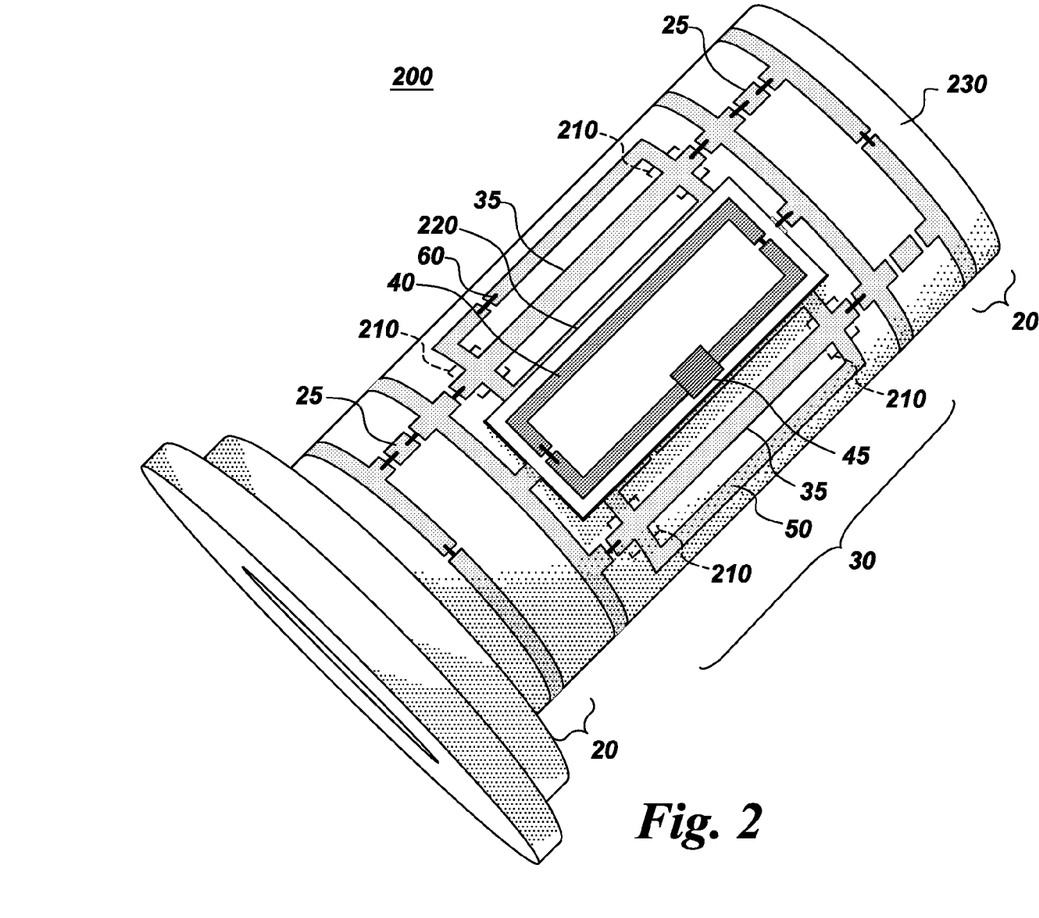
FIG. 2 illustrates a view of a coil structure in accordance with one embodiment.

Referring to FIG. 2, a perspective view of the imaging system coil assembly 200 according to one embodiment is illustrated. The coil assembly 200 is shown as a circular assembly that has an internal section that is sized according to the intended applications. For example, if the coil 200 were intended for human brain imaging, the opening would be sized accordingly.

The outer ring 20 has conductive sections disposed about the dielectric circular housing 230 with corresponding ends and rungs 25, fully extending between the outer rings 20. The inner ring 30 has the ends with a number of rungs 35 disposed about the housing 230. There are coupling loops 50, 60 disposed on the housing 230 with small dielectric sections 210 to keep the coupling loops 50, 60 electrically isolated from the inner ring 30.

The shifting frequency loop 40 is disposed proximate the coil defined by the inner rings 30. In this example the shifting frequency loop 40 is disposed on a dielectric section 220 and placed a small distance above the inner ring 30. There is a switch 45 electrically coupled with the loop structure 40 such that the switch 45 completes the loop electrically when closed.

In one embodiment the carbon coil has the inner ring 30 with eight rungs with corresponding capacitive coupling. There are also two coupling pickup loops 50, 60 that are disposed on top of the inner ring 30 with layers of dielectric material 210 isolating the coupling sections 50, 60 from the conducting traces of inner ring 30. The two pickup coupling loops 50, 60 are positioned approximately ninety degrees apart at the carbon resonant frequency in order to provide quadrature operation.

Various structural modifications are within the scope of this system that extends the scope and applicability. In the illustrated embodiment the outer ring has two rungs providing the proton output. Other examples include further rungs that can be used to provide increased sensitivity and may even employ an additional drive point to provide a quadrature operation at the proton frequency.

In this example, the shifting frequency loop structure is tuned at the carbon frequency and coupled to the dual-tuned coil. The coil operates linearly at the sodium frequency; its sensitivity in one example is not particularly good, however it is sufficient for the prescan. The coil has greater sensitivity in the carbon mode of operation (the coil operates in quadrature during $^{13}$C imaging). In a further embodiment, an additional shifting frequency loop structure is added to improve the sensitivity of the sodium response. The two frequency shifting loop structures can be located ninety degrees apart and provide a quadrature drive at the sodium frequency for greater sensitivity.

Referring again to FIG. 2, in this example, the coil includes a low pass, 8 rung quadrature birdcage carbon coil, sharing two of its legs with a linear proton half-Helmholtz coil. In one embodiment, a frequency shifting loop 40 is tuned at the carbon frequency and coupled to the dual-tuned structure, wherein the shifting frequency loop is located between two drive rungs of the carbon coil.

The circuit of this frequency shifting loop structure can be easily opened or closed using a switching mechanism such as a mechanical, electro-mechanical or electrical switch to couple or decouple the shifting frequency loop from the coil. For example, in an alternative embodiment, a PIN diode may be used to open or close the frequency shifting loop structure. While the circuit is open, the frequency shifting loop has no effect on the tuning or matching of the base dual tuned proton/carbon coil. With the circuit closed, the birdcage and the frequency shifting loop couple, leading to the existence of multiple resonances for the initial carbon birdcage, with one of the resonances at the sodium frequency. At the same time, the proton resonance is typically not affected by the open/closed position of the switching mechanism.

Figure 3:
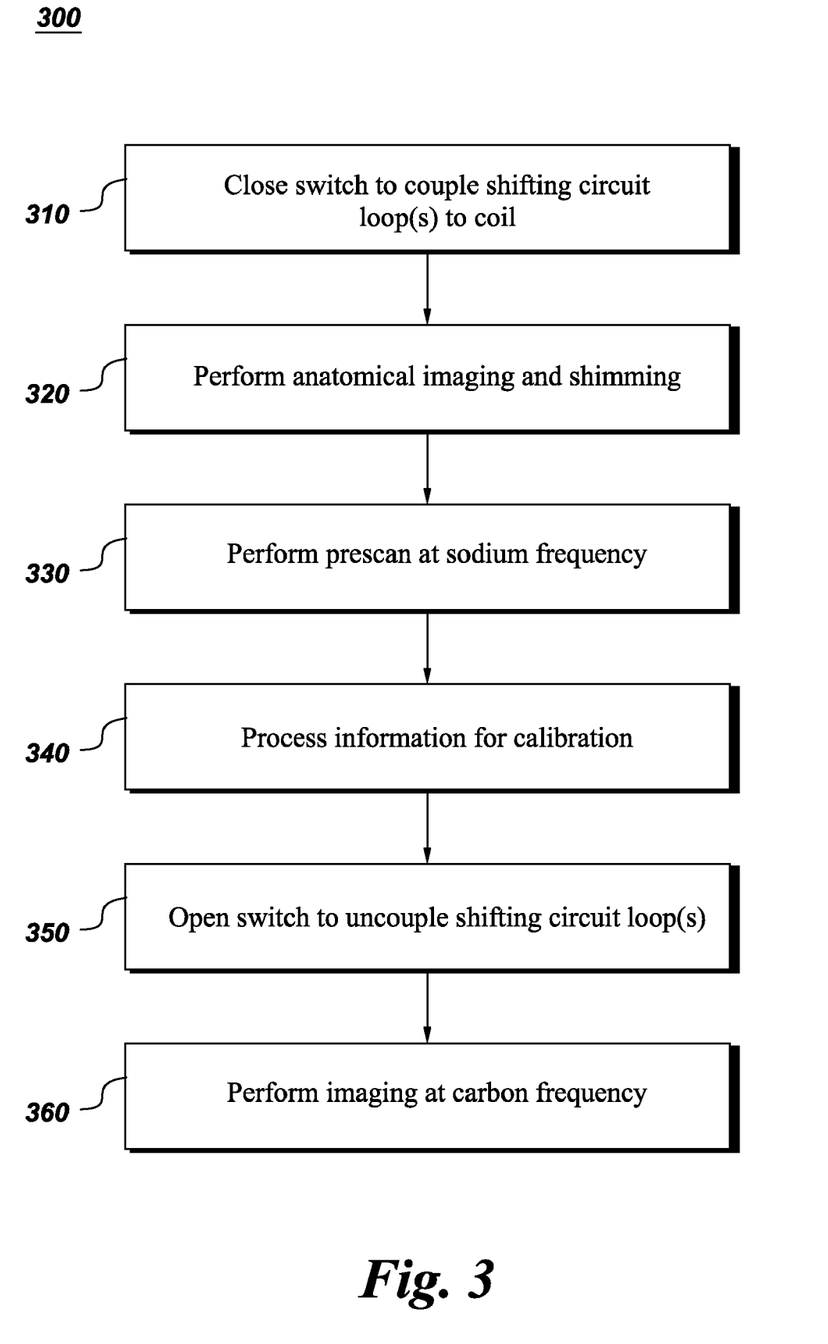
FIG. 3 shows a flowchart of the multi-frequency coil processing in accordance with one embodiment.

Referring to FIG. 3, one simplified method of operation 300 is depicted in accordance with one processing embodiment. In this example, the imaging exam commences with the switch closed in order to couple the shifting circuit loop to the birdcage coil 310. Anatomical imaging is performed as well as any optional shimming 320. In this example the anatomical imaging is performed at the proton frequency.

The prescan is then performed at the sodium frequency for the transmit gain (or flip angle) 330 calibration. The prescan information is processed to provide a calibration for the flip angle at the carbon frequency 340 based on interpolation from the sodium frequency prescan results.

The shifting circuit loop is then disengaged, such as by opening the switch 350, that effectively eliminates the effects of the shifting circuit loop. Once the effects of the shifting circuit loop are removed, imaging can be performed on the calibrated system at the carbon frequency 360. In this example, the clean carbon frequency response is obtained in quadrature from the two coupling loops for better SNR. A linear response is also within the scope of this embodiment if less SNR is acceptable.

Figure 4A:
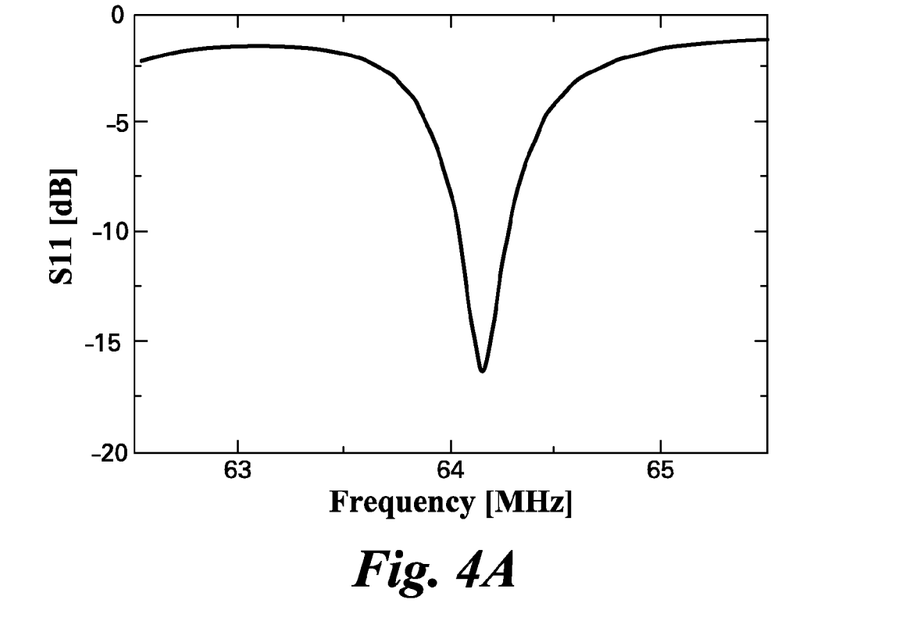
FIG. 4A-4E illustrate various plots associated with operation aspects of the coil depicted in FIGS. 1 and 2.
Figure 4B:
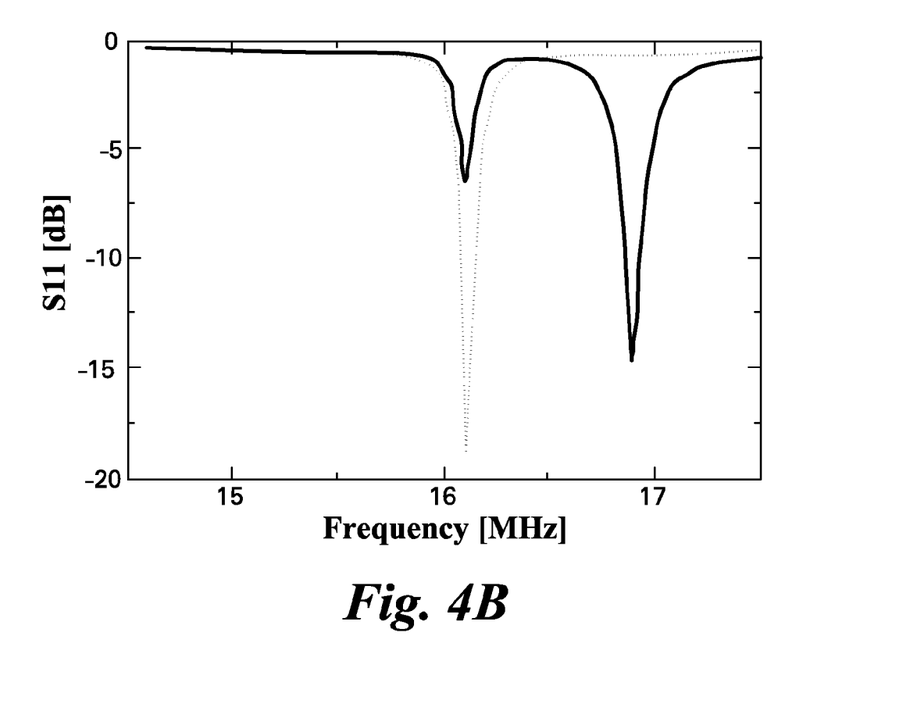
Figure 4C:
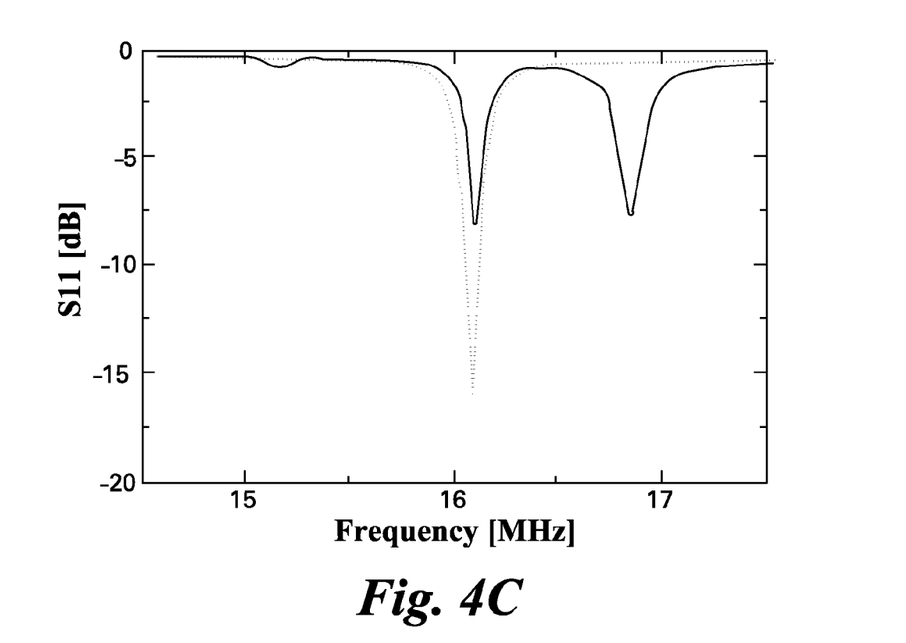

FIGS. 4A-4E illustrate actual bench measurements for the coil and also illustrate the magnitude of the reflection coefficient S11 for the two carbon channels (sodium frequency and carbon frequency) with the frequency shifting loop switch open and closed, and for the proton channel, which was not affected by the position of the switch. Referring to FIG. 4A, the magnitude of the reflection coefficient S11 at the proton frequency is shown. In FIG. 4B, the magnitude of the reflection coefficient S11 is shown for one of the carbon channels with the switch opened (dotted line) and the switch closed (solid line). FIG. 4C shows the magnitude of the reflection coefficient S11 for the other carbon channel with the switch opened (dotted line) and the switch closed (solid line). Closing the circuit of the frequency shifting loop causes a strong perturbation of the linear mode that couples to it, splitting its resonance. With the switch closed (solid line in FIG. 4B) the carbon coil is also sensitive to the sodium frequency at approximately 17 MHz. In contrast, when the switch is open (dotted line in FIGS. 4B and 4C) the carbon coil operates in quadrature at the carbon frequency.

Figure 4D:
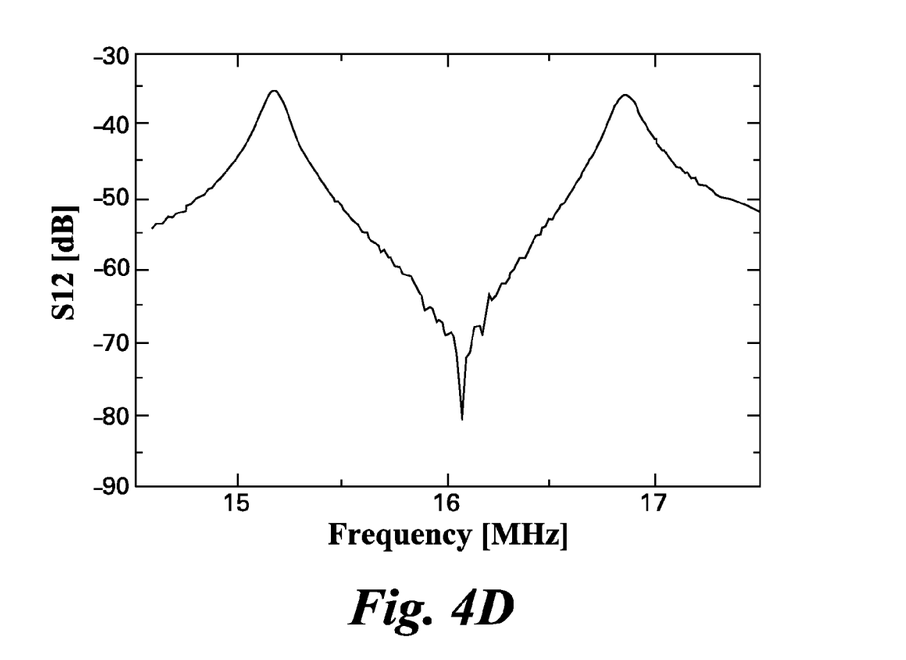

Referring to FIG. 4D, the $S_{21}$ measurements were obtained with the plane of the probing transmit and receive (T/R) coils parallel to the plane of the one turn loop, indicating the presence of a resonance at the sodium frequency, and another resonance symmetrically downfield from the carbon resonance. No carbon resonance exists in this plane.

Figure 4E:
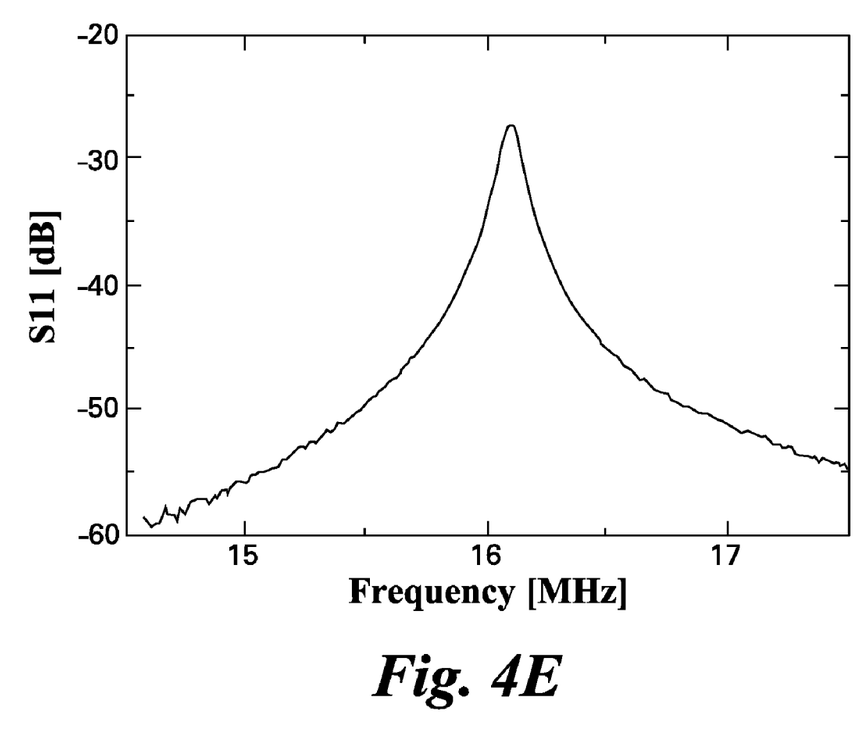

The perturbation induced by the presence of the one turn loop does not affect, however, the other linear mode of the birdcage, which remains tuned to the carbon frequency. FIG. 4e presents the $S_{21}$ measurements obtained with the plane of the probing T/R coils perpendicular to the plane of the one turn loop, confirming the measurement data. Consequently, with the switch of the one-turn loop closed, the initial quadrature $^{13}C$ coil is transformed into a coil with a linear mode at the $^{13}C$ frequency, and a linear mode at the $^{23}Na$ frequency and at a frequency located symmetrically downfield with respect to the $^{13}C$ resonance. Since the orientation of the inductive loops coupling the I and Q channels of the birdcage is neither parallel, nor perpendicular to the plane of the perturbing one-turn loop, a combination of these two fundamental linear modes is exhibited in the $S_{11}$ measurements with the circuit of the one-turn loop closed (solid lines in FIGS. 4b and 4c).

Unloaded quality factors ($Q_u$) for this coil were 134 for the $^{13}C$ resonance (switch open), and 90 for the $^{23}Na$ resonance (switch closed). The ratio between the loaded and unloaded quality factors was $Q_u/Q_l=1.5$ for the carbon resonance (switch open) and $Q_u/Q_l=1.25$ for the sodium resonance (switch closed), indicating that the coil was operating in an intermediate regime (where noise was coming from both the coil and the sample). Moreover, the coil was not loading similarly at the two frequencies.

Figure 5:
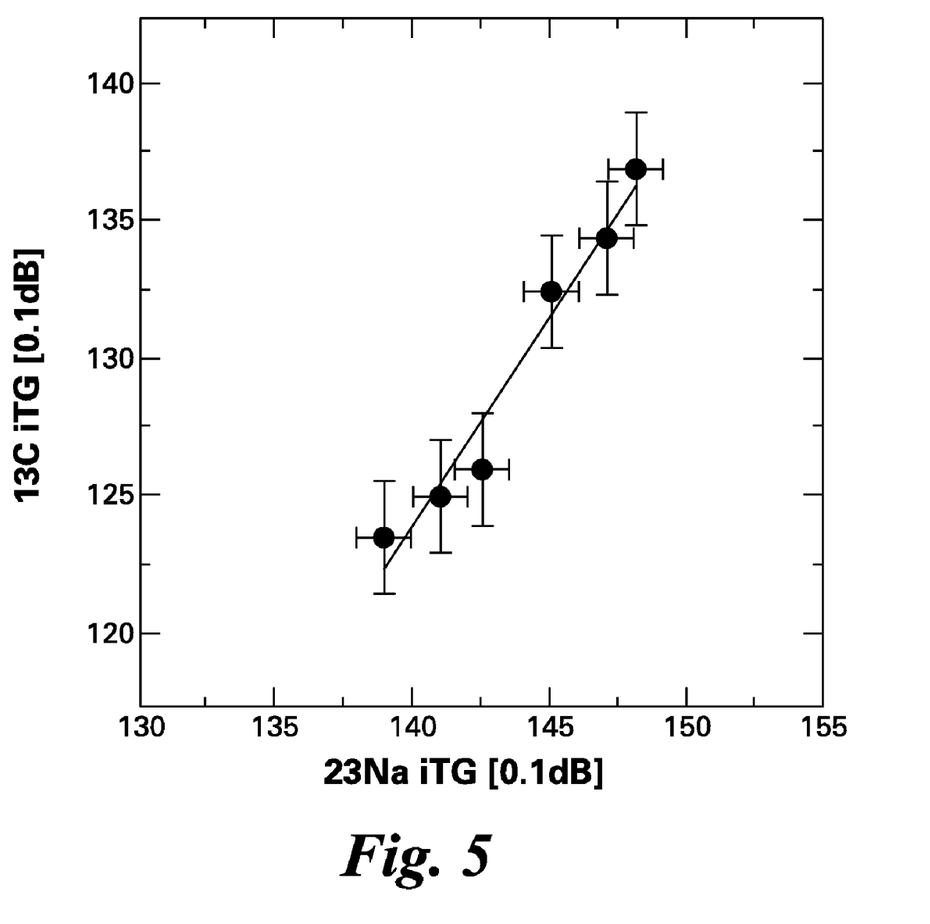
FIG. 5 illustrates a graph of the inversion transmit gains (iTG's) at the $^{13}$C frequency versus the iTG's at the 23Na frequency for a loading phantom.

FIG. 5 illustrates a graph of the inversion transmit gains (iTG's—which represent the TG's for the 180 degree flip angles) at the $^{13}C$ frequency versus the iTG's at the $^{23}Na$ frequency for the loading phantoms. To calibrate this coil for all the ensuing in vivo experiments, the transmit power needed to obtain a given flip angle at the $^{13}C$ and $^{23}Na$ frequencies was measured for six loading phantoms.

The iTG's were measured by a scan operator in a manual prescan by phasing both signals in absorption mode and noting the TG's for which signals were minimized. The uncertainty of the determination of the TG for minimum signal in phantom experiments was low, spanning ~4TG units at the $^{13}C$ frequency, and ~2TG units at the $^{23}Na$ frequency. The median TG's for which the signals were minimized were displayed as data points, while the error bars covered the entire uncertainty range for signal minimization.

In one practical experiment, the birdcage coil including the one turn frequency shifting loop coupled with the birdcage coil, is used for the initial series of an in vivo hyperpolarized exam for slice localization and shimming at the $^1H$ frequency, and for FA calibration at the $^{23}Na$ frequency. The circuit of the external loop is then opened, the birdcage coil returns to its initial dual tuned, $^1H/^{13}C$ mode of operation for the final scan, which maps the location of the injected $^{13}C$ compound and of its downstream metabolites. The use of this coil at its three frequencies ($^1H$ for anatomical localization and shimming, $^{23}Na$ for FA calibration- and $^{23}Na$ imaging, and at $^{13}C$ for imaging is demonstrated in vivo.

In the experimental embodiment, the coil represents a 1.5 T animal coil having a small opening. The coil includes a low-pass dual tuned, $^1H/^{13}C$ coil. An 8 rung, quadrature $^{13}C$ birdcage coil (8 cm diameter, 10 cm length), has two of its rungs, 180 degrees apart, extended to form a linear $^1H$ half-Helmholtz coil, together with two extra end rings, spaced approximately 14.5 cm apart. The traces for this dual tuned coil are approximately 6 mm wide and are typically copper although other suitable conductor traces are within the scope of the system. The $^1H$ coil is capacitively coupled to its drive cable, while the two orthogonal modes of the $^{13}C$ birdcage are inductively coupled to their drive cables.

In the illustrated embodiment, a rectangular one-turn loop, approximately 5.5 cm long and 3 cm wide, is designed to resonate at the $^{13}C$ frequency. In one embodiment, the loop is securely attached above the birdcage coil, symmetrically between the $^{13}C$ birdcage drive rungs. While an open circuit does not affect the tuning or matching of the dual tuned $^1H/^{13}C$ structure, a closed circuit leads to the loop coupling to the circuit of the $^{13}C$ coil and modifying its resonance structure. The distance and slight rotation of this loop from the plastic support cylinder is experimentally chosen to create a resonance at the $^{23}Na$ frequency (16.89 MHz).

In this example a relatively large area for the coupling loop was chosen for this loop to maximize coil coupling, wherein the loop structure is designed to resonate at the $^{13}C$ frequency. The shifting frequency loop structure fits within a coil plastic cover and is placed between the drive ports for the birdcage channels. The spacing and slight rotation/tilt between the loop structure and coil is experimentally adjusted to obtain a resonance at the desired $^{23}Na$ frequency for the birdcage coil. The loop is secured once the optimal response is obtained.

Referring again to the graph of FIG. 5, it can be seen that slightly less power is needed to invert the $^{13}C$ signals than it is to invert the $^{23}Na$ signals. From theoretical considerations, assuming quadrature drive and perfect tuning and matching at both frequencies, the power to get a given FA at the $^{13}C$ frequency should be between 0 and 3 dB higher than the power needed to get the same FA at the $^{23}Na$ frequency, with the exact amount of power increase depending on the dominant source of noise. A 3 dB power increase, however, is needed at the $^{23}Na$ frequency, due to linear operation of the coil at this frequency, compared to quadrature operation at the $^{13}C$ frequency. The observed power increase was ~1.5 dB to get the same FA at the $^{23}Na$ frequency as at the $^{13}C$ frequency.

Further, the graph of FIG. 5 illustrates that the range of variation for the transmit gain needed to invert the signals at both frequencies for various coil loadings is somewhat smaller than typical. Apart from the fact that such finding is not uncommon at low operating frequencies (16-17 MHz), this is also due to the fact that the coil has been tuned while fully loaded. As the loading was decreased in the experiments, competing effects take place, minimizing the effect of the various coil loading to TG variability. For example, smaller loading required smaller absorbed power to obtain a given flip angle. At the same time, however, the coil was becoming slightly mismatched and mistuned, requiring more forward power to obtain the same flip angle. Further, the relationship between the iTG's at the two different frequencies was quite linear. A two parameter linear fit (solid line), governed by the equation y=1.57x−95.9 ($R^2$=0.96) approximates the results.

The coil was used for certain in vivo experiments. Exams were started with the coil operating in its $^1$H/$^{23}$Na mode for anatomical localization and shimming. FA calibration was then accurately performed at the $^{23}$Na frequency. The transmitter frequency of the scanner was subsequently changed to the $^{13}$C resonant frequency, the transmit gain was correspondingly decreased to get the desired flip angle at the $^{13}$C frequency according to the calibration curve for the coil, the loop coil switch opened, and $^{13}$C images were obtained in vivo. No cable connects or disconnects were needed during the exam. The $^1$H channel was always connected, and, given their proximity, both $^{23}$Na and $^{13}$C signals went through the same transmit and receive chain.

For clinical exams, the coils detailed herein have the advantage of allowing accurate completion of all prescan and scan steps, without repositioning the subject, connecting or disconnecting cables or wasting hyperpolarized sample. The FA calibration can also be performed at the $^1$H (instead of $^{23}$Na) frequency, requiring a less complex RF coil for imaging in the presence of hyperpolarized compounds. In most clinical implementations of MRI scanners, however, $^1$H and $^{13}$C signals go through completely different transmit and receive chains (different RF amplifiers, as well as different T/R switches). One embodiment initially calibrates the flip angle at the proton frequency, and then predicts the required transmit power at the $^{13}$C frequency. In this case a slight change in amplifier or T/R switch performance occurs at one of the frequencies, however, consistent errors will show up in the $^{13}$C flip angle calibration.

Modifications can be used to scale the design of this coil for 3 T, wherein the difference between the $^{23}$Na and $^{13}$C resonances slightly exceeds 1.5 MHz. For example, an enlarged area of the one turn-loop may be required to increase the coil coupling. The low noise hardware (preamplifiers, eg) employed in the $^{13}$C exams tends to be highly frequency specific and may decrease the sodium signal to a degree to which hardware modifications are required. Alternatively, FA calibration at the proton frequency can be utilized.

In yet a further embodiment, a larger loop structure can be tuned to $^1$H such that it couples to the $^1$H coil and also tune the larger coil to fluorine. The fluorine ($^{19}$F) resonates at a Larmor frequency of about 60.12 MHz (1.5 T) that is sufficiently close enough to the $^1$H frequency of about 63.87 MHz such that the shifting can be accomplished by the coupling the loop structure. Furthermore, employing one frequency shifting loop structure for shifting between the sodium and carbon frequencies and another frequency shifting loop structure for shifting between the proton and fluorine frequency allows for a four frequency coil.

One example for deployment of the systems described herein relates to accelerated imaging in the presence of hyperpolarized compounds. Reduced number of phase encoding steps, and reduced imaging time is possible in MRI, with the condition of using coil sensitivity profiled to retrieve the information not encoded through gradients. While generation of coil sensitivity profiles prior to the injection of hyperpolarized compounds is impossible due to the lack of endogenous compound, their generation following the injection of the injection compound will waste time, and, in consequence, reduce the SNR of the resulting images. A system of coils tuned to $^{13}$C, that can be made to resonate, through coupling with additional loops, at the sodium frequency, would be able to acquire the coil sensitivity profiles at the sodium frequency, using the endogenous sodium signal. These maps would allow acceleration of $^{13}$C imaging, and increased $^{13}$C image SNR. For example, there would be a B1 map calibration at the sodium frequency to be used for 13C imaging.

One embodiment employs the use of a switchably coupled structure to tune the imaging coils to different frequency response ranges instead of manually tuning the coils.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A multi-frequency imaging coil, comprising:
a radio-frequency coil operational at three or more different frequencies; and
a shifting frequency loop structure disposed on a dielectric substrate that separates said shifting frequency loop structure from said radio-frequency coil and configured to provide at least one of said frequencies when said shifting frequency loop structure is electrically coupled to said radio-frequency coil and another of said frequencies when said shifting frequency loop structure is electrically uncoupled from said radio-frequency coil.

2. The imaging coil according to claim 1, wherein said radio-frequency coil is a dual-tuned birdcage coil and wherein one of said frequencies is a proton frequency, one of said frequencies is a sodium frequency, and one of said frequencies is a carbon frequency.

3. The imaging coil according to claim 2, wherein said birdcage coil operates at said proton frequency at $^1$H approximately 63.87 MHz, said sodium frequency at $^{23}$Na approximately 16.89 MHz, and in quadrature at said carbon frequency at $^{13}$C approximately 16.06 MHz.

4. The imaging coil according to claim 2, wherein said birdcage coil has eight rungs for an inner coil and two rungs for an outer coil.

5. The imaging coil according to claim 2, wherein said frequency shifting loop structure is designed to resonate at said carbon frequency.

6. The imaging coil according to claim 1, wherein said frequency shifting loop structure is a single loop of conductive metal on said dielectric substrate.

7. The imaging coil according to claim 1, wherein said frequency shifting loop structure is electrically coupled to said radio-frequency coil by a switch.

8. The imaging coil according to claim 7, wherein said switch is at least one of an electrical switch, an electromechanical switch, or a mechanical switch.

9. The imaging coil according to claim 7, wherein said switch is a diode or a microelectromechanical switch.

10. A method for acquiring an image with a multiple frequency imaging coil, comprising:
disposing at least one frequency shifting loop on a dielectric substrate to separate said frequency shifting loop from said imaging coil;

electrically coupling said frequency shifting loop to said imaging coil to shift an operating frequency of said imaging coil from a carbon frequency to a sodium frequency;

performing an anatomical imaging of a subject using a proton frequency;

prescanning said subject using said sodium frequency to determine a flip angle calibration for said carbon frequency;

electrically uncoupling said frequency shifting loop from said imaging coil to shift said operating frequency of said imaging coil from said sodium frequency to said carbon frequency; and performing imaging of said subject at said carbon frequency using said flip angle calibration.

11. The method according to claim 10, further comprising injecting said subject with a hyperpolarized contrast agent prior to performing imaging of said subject at said carbon frequency.

12. The method according to claim 10, wherein said electrically coupling and said electrically uncoupling is performed by a switch.

13. The method according to claim 10, wherein said imaging of said subject at said carbon frequency is performed in quadrature.

14. The method according to claim 10, wherein said prescanning uses at least two frequency shifting loops and wherein said prescanning is performed in quadrature.

15. An imaging system for hyperpolarized compounds, comprising:

an imaging coil operational over at least three frequencies; and at least one frequency shifting loop structure disposed on a dielectric substrate that separates said frequency shifting loop structure from said imaging coil and switchably coupled by a switch to said imaging coil, wherein said frequency shifting loop structure shifts one of said frequencies to a frequency for calibration using a naturally occurring compound in a subject when said frequency shifting loop structure is electrically coupled to said imaging coil and performs a hyperpolarized imaging using said hyperpolarized compounds not naturally occurring in said subject when said frequency shifting loop structure is electrically uncoupled from said imaging coil.

16. The system according to claim 15, wherein said frequencies include at least three of a proton frequency, a sodium frequency, a flourine frequency, or a carbon frequency.

17. The system according to claim 16, wherein said imaging system operates linearly at said proton frequency and said sodium frequency, and in quadrature at said carbon frequency.

18. The system according to claim 15, wherein said at least one frequency shifting loop structure comprises two loop structures for a quadrature response for said calibration.

19. The system according to claim 15, wherein said switch is one of an electrical switch, an electro-mechanical switch, a mechanical switch, a diode, or a microelectromechanical switch.

* * * * *